United States Patent [19]
Ueda et al.

[11] Patent Number: 5,282,159
[45] Date of Patent: Jan. 25, 1994

[54] SEMICONDUCTOR MEMORY WITH INCREASED CAPACITIVE STORAGE CAPABILITIES AND REDUCED SIZE

[75] Inventors: Naoki Ueda, Nara; Yoshimitsu Yamauchi, Yamatokoriyama; Kenichi Tanaka, Nara, all of Japan

[73] Assignee: Sharp Kabushiki Kaisha, Osaka, Japan

[21] Appl. No.: 896,436

[22] Filed: Jun. 10, 1992

[30] Foreign Application Priority Data

Nov. 15, 1991 [JP] Japan ................................. 3-300540

[51] Int. Cl.$^5$ ............................................. H01L 27/14
[52] U.S. Cl. .................................. 365/149; 257/306; 257/307; 257/303
[58] Field of Search ................ 365/149; 257/303, 306, 257/269, 300, 304, 305, 307, 308, 309

[56] References Cited

U.S. PATENT DOCUMENTS

| | | | |
|---|---|---|---|
| 4,240,092 | 12/1980 | Kuo | 365/149 |
| 4,460,911 | 7/1984 | Salters | 257/306 |
| 4,641,165 | 2/1987 | Iizuka et al. | 365/149 |
| 4,700,457 | 10/1987 | Matsukawa | 257/306 |

FOREIGN PATENT DOCUMENTS

| | | | |
|---|---|---|---|
| 56-124261 | 9/1981 | Japan | 257/296 |
| 61-82459 | 4/1986 | Japan | 257/307 |

Primary Examiner—Eugene R. LaRoche
Assistant Examiner—Vu A. Le
Attorney, Agent, or Firm—Nixon & Vanderhye

[57] ABSTRACT

A semiconductor memory includes a transistor and a capacitor which are formed on a semiconductor substrate, wherein the capacitor comprises in superposed layers a first capacitor composed of an impurity diffused layer formed in a surface layer of the semiconductor substrate, a first dielectric formed on the impurity diffused layer and a lower plate electrode formed on the first dielectric and serving as a field plate; a second capacitor composed of the lower plate electrode, a second dielectric formed on the lower plate electrode and a node electrode formed on the second dielectric; and a third capacitor composed of the node electrode, a third dielectric formed on the node electrode and an upper plate electrode formed on the third dielectric.

8 Claims, 3 Drawing Sheets

SEMICONDUCTOR MEMORY WITH INCREASED CAPACITIVE STORAGE CAPABILITIES AND REDUCED SIZE

BACKGROUND OF THE INVENTION

1. Field of the Invention

The present invention relates to semiconductor memories, and more particular to MOS semiconductor memories occupying a small area and yet having a great capacitance.

2. Description of the Prior Art

Dynamic random access memories (DRAMs) comprising one transistor and one capacitor are known as the simplest DRAMs. With such memories, the amount of charge in the capacitor is altered by turning on and off a gate by the transistor to store data in the desired memory cell.

FIG. 3 is a sectional diagram showing a stacked DRAM cell. The stacked DRAM cell has a capacitor wherein a thin film of great dielectric constant is held between electrodes to give an increased capacitance per unit area.

With reference to the diagram, indicated at 20 is a silicon substrate formed with a device isolation region 28. With a device forming region thereby defined, the silicon substrate 20 is formed with a gate electrode 23 with an oxide film 22 provided therebetween. The gate electrode 23 is provided as a word line over the silicon substrate 20 to form a select transistor. Source/drain regions 21 are formed in a surface layer of the silicon substrate 20 at opposite ends of the gate electrode 23. A word line 24 for an adjacent cell is provided on the device isolation region 28. A node electrode 25 in contact with one of the source/drain regions 21 extends over the gate electrode 23, over this source/drain region 21 and over the word line 24. A plate electrode 27 is formed over the node electrode 25 with a dielectric 26 interposed therebetween. A bit line 30 is further provided over the plate electrode 27, with an interlayer insulating film 29 formed therebetween, and is connected to the other source/drain region 21 which is not in contact with the node electrode 25.

To hold the electric charge stored in the capacitor of the semiconductor memory described, there is a need to give increased capacitance to the capacitor. However, an increase in the capacitance of the cell is in conflict with a reduction in the cell size, so that attempts to reduce the cell size encounter the problem of necessitating ingenuity in various aspects.

SUMMARY OF THE INVENTION

The present invention provides a semiconductor memory including a transistor and a capacitor which are formed on a semiconductor substrate, the capacitor comprising in superposed layers a first capacitor composed of an impurity diffused layer formed in a surface layer of the semiconductor substrate, a first dielectric formed on the impurity diffused layer and a lower plate electrode formed on the first dielectric and serving as a field plate; a second capacitor composed of the lower plate electrode, a second dielectric formed on the lower plate electrode and a node electrode formed on the second dielectric; and a third capacitor composed of the node electrode, a third dielectric formed on the node electrode and an upper plate electrode formed on the third dielectric.

DESCRIPTION OF THE PREFERRED EMBODIMENTS

According to the present invention, the transistor comprises a source/drain region which has P, As or like n-type impurity element, or boron or like p-type impurity element incorporated therein at a concentration of about $1 \times 10^{14}$ to about $5 \times 10^{15}$ cm$^{-2}$ by ion implantation. Preferably, the source/drain regions of adjacent cells are separated by a device isolation region having a width of 0.5 to 0.6 µm and free from impurity ions.

The transistor to be formed on the semiconductor substrate has a gate oxide film which is preferably an SiO$_2$ film formed by a known process, such as thermal oxidation or CVD, and having a thickness of about 80 to about 120 angstroms. The gate electrode of the transistor may be in the form of a single layer of polysilicon or may have a structure of superposed layers, for example, of polysilicon, SiO$_2$ and SiN. The electrode is preferably about 1500 to about 3000 angstroms in thickness.

According to the invention, the capacitor has a three-layer structure. The first dielectric, the second dielectric and the third dielectric are each preferably in the form of an SiO$_2$ film, Si$_2$/SiN film or the like, and are preferably 80 to 120 angstroms, 50 to 70 angstroms and 50 to 70 angstroms, respectively, in thickness. The lower plate electrode, the node electrode and the upper plate electrode may each have a single-layer structure of polysilicon or a structure of superposed layers, for example, of polysilicon, SiO$_2$ and SiN, and are preferably 2000 to 3000 angstroms, 750 to 1500 angstroms and 750 to 2500 angstroms, respectively, in thickness.

With the semiconductor memory of the invention thus constructed, the capacitor is formed by three component capacitors in superposed layers and therefore has greater capacitance when the cell is formed over the same area as the conventional cell.

Figure 1:
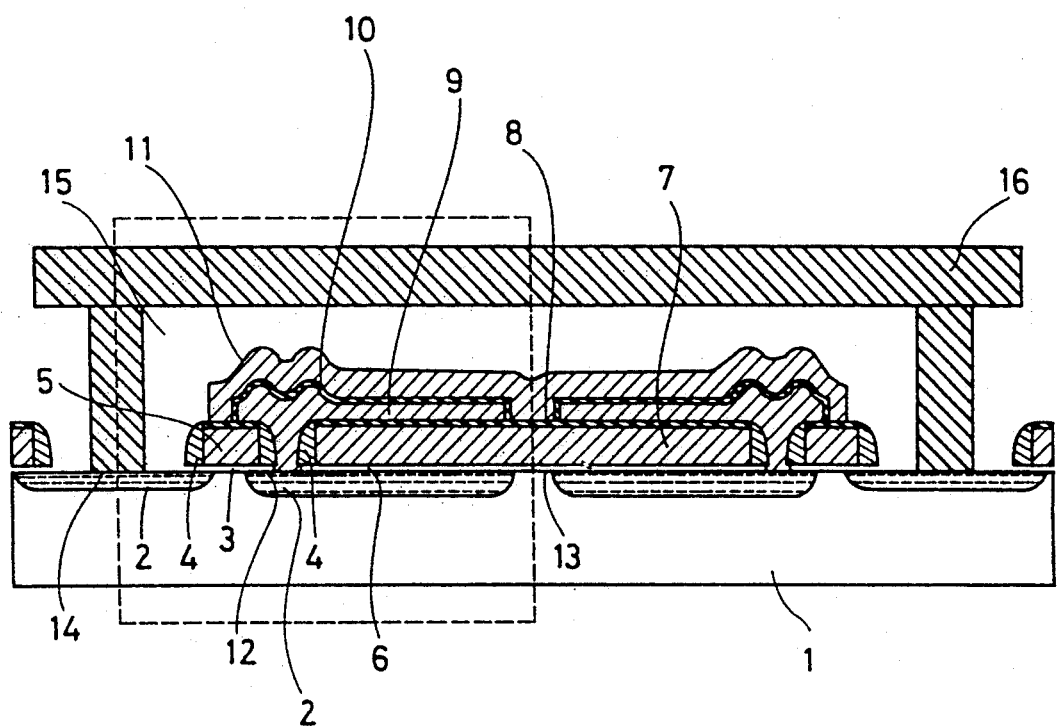
FIG. 1 is a sectional view schematically showing a semiconductor memory embodying the invention.

Since the lower plate electrode is formed as a field plate, a field transistor is formed at the device isolation region indicated at 13 and shown in FIG. 1. Accordingly, it follows that the lower plate electrode, indicated at 7 and serving as the gate electrode of the field transistor, has a fixed potential of 0 V at all times. When the region under the lower plate electrode 7 serving as the gate electrode is set to not lower than about 0.8 V in threshold voltage, the field transistor remains nonconducting at all times to serve the function of device isolation. The device isolation region 13 can therefore be smaller.

A DRAM embodying the invention and comprising a transistor and a capacitor will be described with reference to the drawings concerned.

The semiconductor memory shown in FIG. 1 includes a silicon substrate 1 which is formed in its surface layer with source/drain regions 2 having an LDD region. Between one of the source/drain regions 2 and another one 2, a gate electrode 5 provided with sidewalls 4 is formed on the silicon substrate 1, with an SiO$_2$ film 3 as a gate oxide film interposed between the electrode and the substrate. A lower plate electrode 7 serving as a field plate is formed over one of the above-mentioned two source/drain regions 2, with an SiO$_2$ film 6 as a first dielectric interposed therebetween, and further extends over a device isolation region 13 and over a portion of the silicon substrate 1 providing an adjacent cell. An insulating film, and an SiO$_2$ film 8 as a second dielectric are formed on the gate electrode 5 and the lower plate electrode 7, respectively. A node electrode 9 having a contact 12 on the source/drain region 2 is provided over the gate electrode 5 and the lower plate electrode 7. Further formed over the node electrode 9 are an SiO$_2$/SiN film 10 as a third dielectric and an upper plate electrode 11 on the film 10. An interlayer insulating film 15 is formed over the upper plate electrode 11. The portion of the interlayer insulating film 15 on the other source/drain region 2 opposite to the source/drain region 2 having the lower plate electrode 7 thereover is provided with a bit contact 14 which is joined to a bit line 16 formed over the interlayer insulating film 15.

Thus, the DRAM has a capacitor which comprises in superposed layers a first capacitor composed of an SiO$_2$ film 6 formed as a first dielectric on the surface layer of a silicon substrate and a lower plate electrode 7 formed on the SiO$_2$ film 6 and serving as a field plate; a second capacitor composed of the lower plate electrode 7, an SiO$_2$ film 8 formed as a second dielectric on the lower plate electrode 7 and a node electrode 9 formed on the SiO$_2$ film 8; and a third capacitor composed of the node electrode 9, an SiO$_2$/SiN film 10 formed as a third dielectric on the node electrode 9 and an upper plate electrode 11 formed on the SiO$_2$/SiN film 10.

The DRAM having the above construction is produced by the process to be described below.

Figure 2:
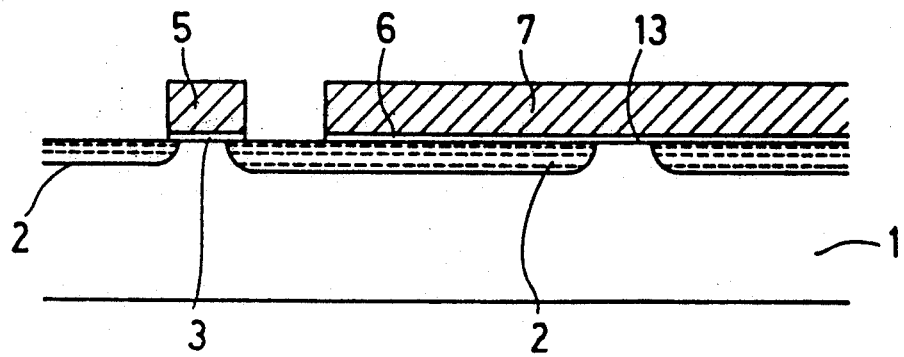
FIGS. 2(a)–2(c) show a sectional view schematically showing a process for producing the semiconductor memory of the invention.
Figure 2:
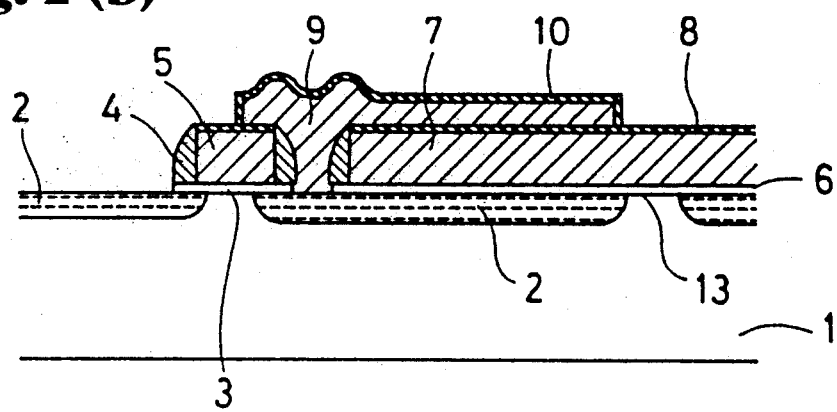
Figure 2:
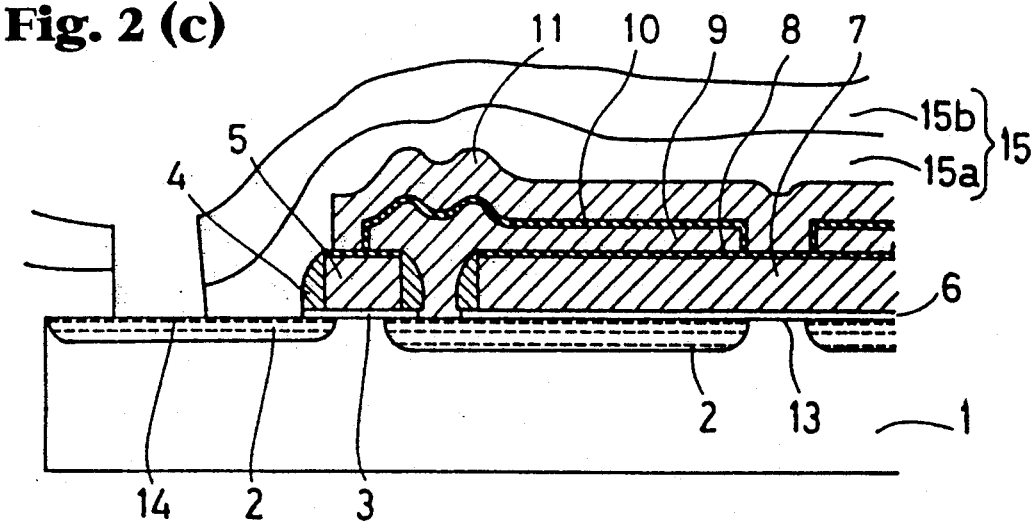
Figure 3:
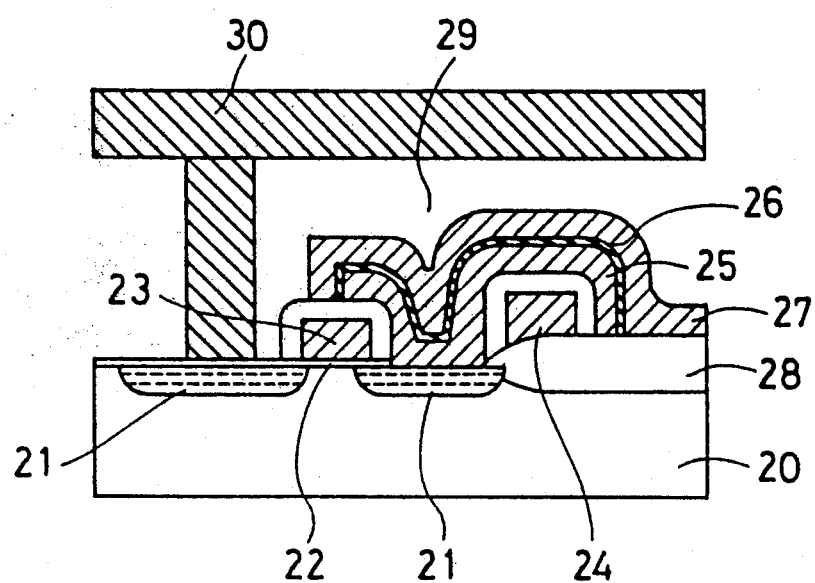
FIG. 3 is a sectional view schematically showing a conventional semiconductor memory.

First, P, As or like n-type impurity element was introduced at a concentration of about $1 \times 10^{15}$cm$^{-2}$ into a surface of a silicon substrate 1 by ion implantation over the region thereof on which the lower plate electrode 7 was to be formed later. The boundary between adjacent cells was not subjected to ion implantation to provide a device isolation region 13 having a width of about 0.5 μm. Next, an SiO$_2$ film having a thickness of about 100 angstroms was formed as the gate oxide film 3 or as the first dielectric 6 over the entire surface of the silicon substrate 1 by thermal oxidation. The gate electrode 5 and the lower plate electrode 7 were then formed at the same time by forming a layer of polysilicon having a thickness of about 2000 angstroms over the film, practicing the CVD process to deposit SiN on the polysilicon layer to a thickness of about 100 angstroms and further SiO$_2$ on the SiN to a thickness of about 1500 angstroms, and etching the resulting layer in the known manner. An LDD region was thereafter formed using the gate electrode 5 and the lower plate electrode 7 as a mask and implanting, for example, P ions to a concentration of about $1 \times 10^{13}$ cm$^{-2}$ (FIG. 2, (a)).

Subsequently, SiN was deposited on the gate electrode 5 and the lower plate electrode 7 to a thickness of abut 1500 angstroms, followed by RIE to form sidewalls 4 on the gate electrode 5 and the lower plate electrode 7 and by HF wet etching to remove the SiO$_2$ film from the lower plate electrode 7. The SiN film was thereafter thermally oxidized to a thickness of about 30 angstroms from its surface to form the second dielectric 8 of SiO$_2$. Next, a window for the direct contact 12 of the node electrode 9 was formed by etching for the source/drain region 2 of the memory cell gate transistor, followed by deposition of polysilicon to a thickness of about 1500 angstroms and by etching of the polysilicon in the known manner to form the node electrode 9. The third dielectric was further formed over the node electrode 9 by depositing SiO$_2$/SiN to a thickness of about 70 angstroms calculated as SiO$_2$ as indicated at 10 (FIG. 2, (b)).

A layer of polysilicon having a thickness of about 2000 angstroms was then formed over the third dielectric 10 and thereafter etched in the same manner as above to form the upper plate electrode 11. Next, the interlayer insulating film 15 was formed over the silicon substrate 2 and the upper plate electrode 11 by depositing NSG 15a to a thickness of about 1500 angstroms and BPSG 15b to a thickness of about 6000 angstroms (FIG. 2, (c)). The interlayer insulating film 15 on the source/drain region 2 opposite to the region 2 formed with the upper and lower plate electrodes 11, 7 was thereafter locally removed, and the bit contract 14 and the bit line (16, in FIG. 1) were formed.

What we claim is:

1. A semiconductor memory including a plurality of adjacent memory cells, wherein each memory cell comprises in superposed layers:

a transistor including a gate electrode formed on the semiconductor substrate and a set of source/drain regions;

a first capacitor including an impurity diffused layer which is formed in a surface layer of the semiconductor substrate and is connected with one of the source/drain regions, a first dielectric formed on the impurity diffused layer and a lower plate electrode formed on the first dielectric and serving as a field plate used in common with an adjacent memory cell;

a second capacitor including the lower plate electrode, a second dielectric formed on the lower plate electrode and a node electrode formed on the second dielectric and connected to one of the source/drain regions; and a third capacitor including the node electrode, a third dielectric formed on the node electrode and an upper plate electrode formed on the third dielectric, wherein the upper plate electrode is used in common with the adjacent memory cell.

2. A semiconductor memory as defined in claim 1 wherein the first, second and third dielectrics are made of an SiO$_2$ film or an SiO$_2$/SiN film.

3. A semiconductor memory as defined in claim 1 wherein the first, second and third dielectrics are 80±120 angstroms, 50-70 angstroms and 50-70 angstroms, respectively, in thickness.

4. A semiconductor memory as defined in claim 1 wherein the lower plate electrode, the node electrode and the upper plate electrode are made of polysilicon.

5. A semiconductor memory as defined in claim 1 wherein the lower plate electrode, the node electrode and the upper plate electrode are 2000 to 3000 angstroms, 750 to 1500 angstroms and 750 to 2500 angstroms, respectively, in thickness.

6. A semiconductor memory according to claim 1, further comprising an isolation region between source/drain regions of adjacent memory cells, wherein the upper and lower plate electrodes are formed over the isolation region and one source/drain region of the adjacent memory cell.

7. A semiconductor memory according to claim 6, wherein the isolation region is set to a predetermined voltage to ensure that a second transistor, formed from one of a set of source/drain regions of adjacent memory cells, and the lower plate electrode, is nonconducting.

8. A semiconductor memory according to claim 1, further comprising:

an interlayer insulator formed over the upper plate electrode, and a bit line conductor formed on the interlayer insulator and connected to a source/drain region in an adjacent memory cell.

* * * * *